(12) United States Patent
Nishii et al.

(10) Patent No.: US 10,490,408 B2
(45) Date of Patent: Nov. 26, 2019

(54) METHOD FOR MANUFACTURING SEMICONDUCTOR DEVICE

(71) Applicant: TOYODA GOSEI CO., LTD., Kiyosu-shi (JP)

(72) Inventors: Junya Nishii, Kiyosu (JP); Tohru Oka, Kiyosu (JP); Nariaki Tanaka, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 146 days.

(21) Appl. No.: 15/916,053

(22) Filed: Mar. 8, 2018

(65) Prior Publication Data

US 2018/0286685 A1    Oct. 4, 2018

(30) Foreign Application Priority Data

Mar. 28, 2017 (JP) .................. 2017-062668

(51) Int. Cl.
 *H01L 21/265* (2006.01)
 *H01L 21/266* (2006.01)
 (Continued)

(52) U.S. Cl.
 CPC .... *H01L 21/26546* (2013.01); *H01L 21/0254* (2013.01); *H01L 21/0262* (2013.01);
 (Continued)

(58) Field of Classification Search
 CPC ........... H01L 21/26546; H01L 21/0254; H01L 21/0262; H01L 21/2253; H01L 21/26586;
 (Continued)

(56) References Cited

U.S. PATENT DOCUMENTS 5,689,128 A * 11/1997 Hshieh ................ H01L 29/0878
 257/331
5,910,669 A    6/1999 Chang et al.
 (Continued)

FOREIGN PATENT DOCUMENTS

JP    H 06-224437 A    8/1994
JP    2001-267570 A    9/2001
JP    2009-117593 A    5/2009

OTHER PUBLICATIONS

IEEE Electron Device, Letters, vol. 37, No. 4 Apr. 2016 p. 463-466.

*Primary Examiner* — Peniel M Gumedzoe
(74) *Attorney, Agent, or Firm* — McGinn IP Law Group, PLLC

(57) ABSTRACT

A method for manufacturing a semiconductor device comprises: a stacking process that stacks a p-type semiconductor layer of Group III nitride containing a p-type impurity on a first n-type semiconductor layer of Group III nitride containing an n-type impurity; a p-type ion implantation process that ion-implants the p-type impurity into the p-type semiconductor layer; and a heat treatment process that performs heat treatment to activate the ion-implanted p-type impurity. The p-type ion implantation process and the heat treatment process are performed such that the p-type impurity of the p-type semiconductor layer is diffused into the n-type semiconductor layer to form a first p-type impurity containing region in at least part of the first n-type semiconductor layer and below a region of the p-type semiconductor layer into which the ion implantation has been performed.

8 Claims, 11 Drawing Sheets

(51) Int. Cl.
*H01L 21/324* (2006.01)
*H01L 21/225* (2006.01)
*H01L 21/28* (2006.01)
*H01L 21/02* (2006.01)
*H01L 29/20* (2006.01)
*H01L 29/205* (2006.01)
*H01L 29/423* (2006.01)
*H01L 29/778* (2006.01)
*H01L 29/66* (2006.01)

(52) U.S. Cl.
CPC ........ *H01L 21/2253* (2013.01); *H01L 21/266* (2013.01); *H01L 21/26586* (2013.01); *H01L 21/28264* (2013.01); *H01L 21/3245* (2013.01); *H01L 29/2003* (2013.01); *H01L 29/205* (2013.01); *H01L 29/4236* (2013.01); *H01L 29/66462* (2013.01); *H01L 29/7788* (2013.01)

(58) Field of Classification Search
CPC ............. H01L 21/266; H01L 21/28264; H01L 21/3245; H01L 29/2003; H01L 29/205; H01L 29/4236; H01L 29/66462; H01L 29/7788
See application file for complete search history.

(56) References Cited

U.S. PATENT DOCUMENTS

| | | | | |
|---|---|---|---|---|
| 6,645,815 | B2* | 11/2003 | Hshieh ............ | H01L 21/823487 438/270 |
| 8,022,414 | B2* | 9/2011 | Suzuki ................ | H01L 29/0623 257/77 |
| 2009/0114969 | A1 | 5/2009 | Suzuki et al. | |

* cited by examiner

METHOD FOR MANUFACTURING SEMICONDUCTOR DEVICE

CROSS-REFERENCE TO RELATED APPLICATION

This application claims priority to Japanese Patent Application No. 2017-062668 filed on Mar. 28, 2017, the entire contents of which are incorporated by reference herein.

BACKGROUND

Technical Field

The present disclosure relates to a method for manufacturing a semiconductor device.

Related Art

Conventionally, there have been known semiconductor devices including a p-type impurity containing region in an n-type semiconductor layer (for example, JP-A-1994-224437, JP-A-2001-267570, and JP-A-2009-117593). JP-A-1994-224437, JP-A-2001-267570, and JP-A-2009-117593 disclose a method in which ion implantation is performed to form a p-type impurity containing region in an n-type semiconductor layer.

Some semiconductors, such as gallium nitride (GaN) semiconductor, however, have difficulty in forming such a p-type impurity containing region by ion implantation. The ion implantation may cause a defect of crystal in the semiconductor, and there may be unfortunate cases in which it is unlikely to recover the defect of crystal even by heat treatment. Such undesirable circumstances have occurred not only in the case of gallium nitride (GaN) but commonly in cases of Group III nitride semiconductors. In view of this, there has been a need for a technique of forming the p-type impurity containing region in the n-type semiconductor layer without ion implantation of the p-type impurity into the n-type semiconductor layer.

SUMMARY

The present disclosure has been achieved to at least partly solve the circumstances described above. The present disclosure is implementable in accordance with the following aspects.

(1) According to one aspect of the present disclosure, there is provided a method for manufacturing a semiconductor device. The method for manufacturing the semiconductor device comprises a stacking process, a p-type ion implantation process, and a heat treatment process. In the stacking process, a p-type semiconductor layer of Group III nitride containing a p-type impurity is stacked on a first n-type semiconductor layer of Group III nitride containing an n-type impurity. In the p-type ion implantation process, ion implantation of the p-type impurity into the p-type semiconductor layer is performed. In the heat treatment process, heat treatment is performed to activate the ion-implanted p-type impurity. The p-type ion implantation process and the heat treatment process are performed such that the p-type impurity of the p-type semiconductor layer is diffused into the n-type semiconductor layer to form a first p-type impurity containing region in at least part of the first n-type semiconductor layer and below a region of the p-type semiconductor layer into which the ion implantation has been performed. The method for manufacturing the semiconductor device according to this aspect ensures that the p-type semiconductor containing region is formed in the n-type semiconductor layer without ion implantation of the p-type impurity into the first n-type semiconductor layer.

(2) The method for manufacturing the semiconductor device according to the above-described aspect may further comprise an n-type ion implantation process that performs n-type ion implantation of the n-type impurity into the p-type semiconductor layer after the stacking process and before the heat treatment process. The n-type ion implantation process and the heat treatment process are performed such that an n-type semiconductor region is formed on a surface of the p-type semiconductor layer, and the p-type impurity of the p-type semiconductor layer is diffused into the first n-type semiconductor layer to form a second p-type impurity containing region in at least part of the first n-type semiconductor layer and below the n-type semiconductor region. The method for manufacturing the semiconductor device according to this aspect ensures that the p-type semiconductor containing region is formed in the n-type semiconductor layer without ion implantation of the p-type impurity into the first n-type semiconductor layer.

(3) The method for manufacturing the semiconductor device according to the above-described aspect may further comprise a trench forming process that forms a trench that is recessed to pass through the n-type semiconductor region and the p-type semiconductor layer and reach the first n-type semiconductor layer. In a stacking direction of the first n-type semiconductor layer and the p-type semiconductor layer, a bottom face of the second p-type impurity containing region may be located to be flush with a bottom face of the trench or below the bottom face of the trench. The method for manufacturing the semiconductor device according to this aspect ensures that potential crowding is suppressed in the vicinity of the outer periphery of the bottom face of the trench.

(4) In the method for manufacturing the semiconductor device according to the above-described aspect, the trench forming process may be performed after the n-type ion implantation process. In the trench forming process, the trench may be formed at a position overlapped with at least part of the second p-type impurity containing region in such a manner that at least part of the bottom face of the trench may be formed by the second p-type impurity containing region. The method for manufacturing the semiconductor device according to this aspect ensures that potential crowding is suppressed in the vicinity of the outer periphery of the bottom face of the trench.

(5) The method for manufacturing the semiconductor device according to the above-described aspect may further comprise: a process that forms an insulation film inside of the trench; a process that forms a first electrode in contact with the n-type semiconductor region; a process that forms a second electrode in contact with the first n-type semiconductor layer; and a process that forms a control electrode on the insulation film. The control electrode may be configured to control a flow of electric current between the first electrode and the second electrode. The method for manufacturing the semiconductor device according to this aspect ensures that the p-type semiconductor containing region is formed in the n-type semiconductor layer without ion implantation of the p-type impurity into the first n-type semiconductor layer.

(6) According to the other aspect of the present disclosure, there is provided a method for manufacturing a semiconductor device. The method for manufacturing the semiconductor device comprises a stacking process, a p-type ion implantation process, and a heat treatment process. In the stacking process, a p-type semiconductor layer of Group III nitride containing a p-type impurity is stacked on a first n-type semiconductor layer of Group III nitride containing an n-type impurity, and a second n-type semiconductor layer of Group III nitride containing the n-type impurity is stacked on the p-type semiconductor layer. In the p-type ion implantation process, the p-type impurity is ion-implanted into the second n-type semiconductor layer is performed. In the heat treatment process, heat treatment is performed to activate the ion-implanted p-type impurity. The p-type ion implantation process and the heat treatment process are performed such that the p-type impurity of the p-type semiconductor layer is diffused into the first n-type semiconductor layer to form a p-type impurity containing region in at least part of the first n-type semiconductor layer and below a region of the second n-type semiconductor layer into which the ion implantation has been performed. The method for manufacturing the semiconductor device according to this aspect ensures that the p-type semiconductor containing region is formed in the n-type semiconductor layer without ion implantation of the p-type impurity into the first n-type semiconductor layer.

(7) The method for manufacturing the semiconductor device according to the above-described aspect may further comprise a trench forming process that forms a trench that is recessed to pass through the second n-type semiconductor layer and the p-type semiconductor layer and reach the first n-type semiconductor layer. In a stacking direction of the first n-type semiconductor layer and the p-type semiconductor layer, a bottom face of the p-type impurity containing region may be located to be flush with a bottom face of the trench or below the bottom face of the trench. The method for manufacturing the semiconductor device according to this aspect ensures that potential crowding is suppressed in the vicinity of the outer periphery of the bottom face of the trench.

(8) The method for manufacturing the semiconductor device according to the above-described aspect may further comprise: a process that forms an insulation film inside of the trench; a process that forms a first electrode in contact with the second n-type semiconductor layer; a process that forms a second electrode in contact with the first n-type semiconductor layer; and a process that forms a control electrode on the insulation film. The control electrode may be configured to control a flow of electric current between the first electrode and the second electrode. The method for manufacturing the semiconductor device according to this aspect ensures that the p-type semiconductor containing region is formed in the n-type semiconductor layer without ion implantation of the p-type impurity into the first n-type semiconductor layer.

The present disclosure may be implemented in various modes other than the method for manufacturing the semiconductor device. For example, the present disclosure is implementable in such a mode as an apparatus of manufacturing the semiconductor device utilizing the above-described manufacturing method.

The method for manufacturing the semiconductor device according to the present disclosure ensures that the p-type semiconductor containing region is formed in the n-type semiconductor layer without ion implantation of the p-type impurity into the n-type semiconductor layer.

DESCRIPTION OF EMBODIMENTS

A. First Embodiment

A-1. Configuration of Semiconductor Device

Figure 1:
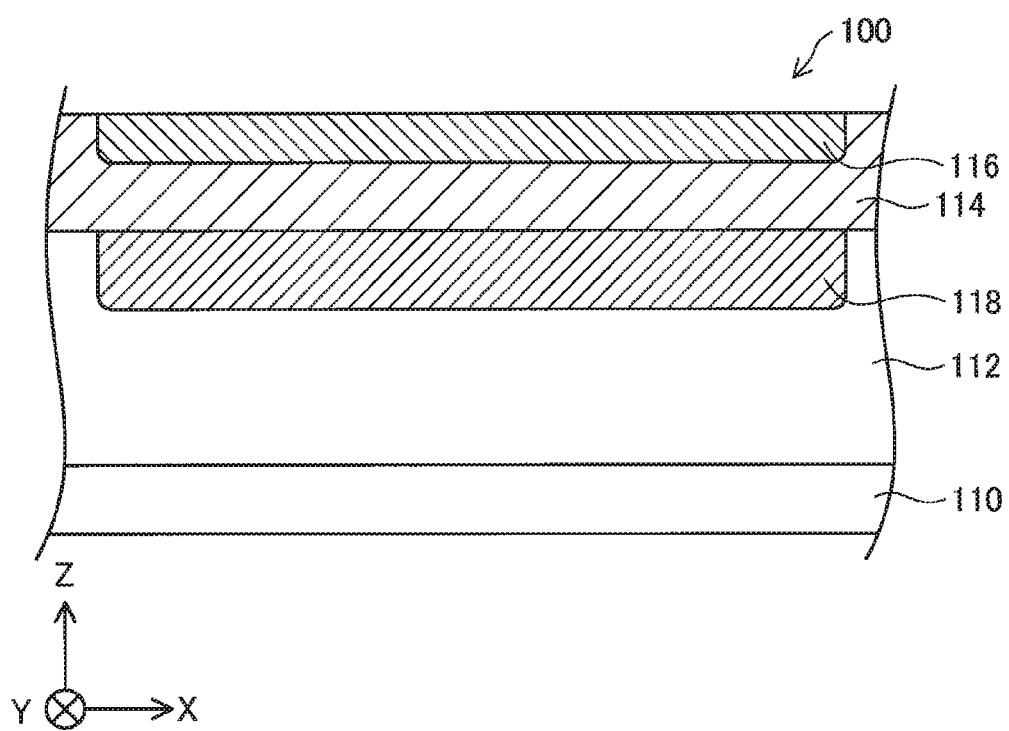
FIG. 1 is a sectional view of a semiconductor device according to a first embodiment, schematically illustrating its configuration.

FIG. 1 is a sectional view of a semiconductor device 100 according to a first embodiment, schematically illustrating its configuration. The semiconductor device 100 is a GaN-based semiconductor device formed using gallium nitride (GaN).

XYZ-axes orthogonal to one another are illustrated in FIG. 1. Among the XYZ-axes of FIG. 1, the X-axis denotes a left-right axis on the sheet surface of FIG. 1. +X-axis direction denotes a rightward direction on the sheet surface, and −X-axis direction denotes a leftward direction on the sheet surface. Among the XYZ-axes of FIG. 1, the Y-axis denotes a front-back axis on the sheet surface of FIG. 1. +Y-axis direction denotes a backward direction on the sheet surface, and −Y-axis direction denotes a forward direction on the sheet surface. Among the XYZ-axes of FIG. 1, the Z-axis denotes a bottom-top axis on the sheet surface of FIG. 1. +Z-axis direction denotes an upward direction on the sheet surface, and −Z-axis direction denotes a downward direction on the sheet surface.

The semiconductor device 100 includes a substrate 110, an n-type semiconductor layer 112, a p-type impurity containing region 118, a p-type semiconductor layer 114, and an ion-implanted region 116.

The substrate 110 of the semiconductor device 100 is a plate-shaped semiconductor extended along the X-axis and the Y-axis. In this embodiment, the substrate 110, the n-type semiconductor layer 112, and the p-type semiconductor layer 114 are made of Group III nitride semiconductor. As Group III nitride semiconductor, for example, gallium nitride (GaN), aluminum nitride (AlN), aluminum gallium nitride (AlGaN), indium gallium nitride (InGaN), and indium aluminum gallium nitride (InAlGaN) may be used. In view of use for the semiconductor device for power control, gallium nitride (GaN) and aluminum gallium nitride (AlGaN) are preferable as Group III nitride semiconductor. In this embodiment, gallium nitride (GaN) is used as Group III nitride semiconductor. It should be noted that insofar as the effects of this embodiment can be obtained, part of gallium nitride (GaN) may be replaced with other Group III elements such as aluminum (Al) and indium (In), and gallium nitride (GaN) may contain other impurities.

In this embodiment, the substrate 110 is an n-type semiconductor layer containing silicon (Si) as an n-type impurity. In this embodiment, the substrate 110 has an average concentration of silicon (Si) of $1.0 \times 10^{18}$ cm$^{-3}$.

The n-type semiconductor layer 112 of the semiconductor device 100 is a semiconductor layer located on the +Z-axis direction side of the substrate 110 and extended along the X-axis and the Y-axis. In this embodiment, the n-type semiconductor layer 112 is an n-type semiconductor layer containing silicon (Si) as an n-type impurity. Preferably, the n-type semiconductor layer 112 has an average concentration of silicon (Si) of $1.0 \times 10^{15}$ cm$^{-3}$ or more and $1.0 \times 10^{17}$ cm$^{-3}$ or less. In this embodiment, the n-type semiconductor layer 112 has an average concentration of silicon (Si) of $1.0 \times 10^{16}$ cm$^{-3}$, which is less than the average concentration of silicon (Si) of the substrate 110. Preferably, the n-type semiconductor layer 112 has a thickness (dimension in the Z-axis direction) of 3 μm or more and 30 μm or less. In this embodiment, the thickness of the n-type semiconductor layer 112 is 10 μm. It should be noted that the n-type semiconductor layer 112 will be also referred to as first n-type semiconductor layer.

The p-type impurity containing region 118 of the semiconductor device 100 is a partial region of the n-type semiconductor layer 112 on the +Z-axis direction side. Preferably, in order to obtain desired properties, the p-type impurity containing region 118 has a p-type impurity concentration of $2.0 \times 10^{17}$ cm$^{-3}$. In this embodiment, the p-type impurity containing region 118 has a p-type impurity concentration of $1.0 \times 10^{18}$ cm$^{-3}$ or more. The p-type impurity containing region 118 is a semiconductor region extended along the X-axis and the Y-axis. In this embodiment, the p-type impurity containing region 118 has a p-type impurity concentration lower than the p-type semiconductor layer 114. In this embodiment, the p-type impurity containing region 118 contains silicon (Si) as an n-type impurity, and also contains magnesium (Mg) as a p-type impurity.

The p-type impurity containing region 118 has a top face (face on the +Z-axis direction side) in contact with the p-type semiconductor layer 114. The p-type impurity containing region 118 is located below the ion-implanted region 116, and is a region into which a p-type impurity of the p-type semiconductor layer 114 is diffused through an ion-implanted region forming process (process P110), described later. Here, "being located below the ion-implanted region 116" refers to being located more on the n-type semiconductor layer 112 side (−Z-axis direction side) than on the p-type semiconductor layer 114 side in a stacking direction (Z-axis direction) of the n-type semiconductor layer 112 and the p-type semiconductor layer 114, and also refers to being at least partly overlapped with the ion-implanted region 116 as viewed in the stacking direction (Z-axis direction). The thickness (dimension in the Z-axis direction) of the p-type impurity containing region 118 has a correlation with the thickness and the concentration of the ion-implanted region 116. In this embodiment, the thickness of the p-type impurity containing region 118 is equal to or less than 1.0 μm.

The p-type semiconductor layer 114 of the semiconductor device 100 is a semiconductor layer located on (the +Z-axis direction side of) the n-type semiconductor layer 112, and extended along the X-axis and the Y-axis. In this embodiment, the p-type semiconductor layer 114 is a p-type semiconductor layer containing the p-type impurity. As the p-type impurity, for example, at least one of magnesium (Mg), zinc (Zn), beryllium (Be), and carbon (C) may be used. In this embodiment, the p-type semiconductor layer 114 contains magnesium (Mg) as the p-type impurity.

The p-type semiconductor layer 114 has an average concentration of magnesium (Mg) of $4.0 \times 10^{18}$ cm$^{-3}$. In this embodiment, the thickness (dimension in the Z-axis direction) of the p-type semiconductor layer 114 is equal to or less than 1.0 μm. In this embodiment, as viewed in the stacking direction of the n-type semiconductor layer 112 and the p-type semiconductor layer 114, the portion of the p-type semiconductor layer 114 that is overlapped with the p-type impurity containing region 118 has an average p-type impurity concentration less than the portion of the p-type semiconductor layer 114 that is not overlapped with the p-type impurity containing region 118.

The ion-implanted region 116 of the semiconductor device 100 is a partial region of the p-type semiconductor layer 114 on the +Z-axis direction side, and contains a p-type impurity. The ion-implanted region 116 is a semiconductor region extended along the X-axis and the Y-axis. In this embodiment, the ion-implanted region 116 is formed by ion implantation of magnesium (Mg) into the partial region of the p-type semiconductor layer 114 on the +Z-axis direction side. It should be noted that as the p-type impurity for ion implantation, for example, at least one of magnesium (Mg), zinc (Zn), and carbon (C) may be used. In this embodiment, as the p-type impurity for ion implantation, magnesium (Mg) is used. In this embodiment, the ion-implanted region 116 has a p-type impurity concentration of $4.0 \times 10^{18}$ cm$^{-3}$ or more. In this embodiment, the thickness (dimension in the Z-axis direction) of the ion-implanted region 116 is equal to or less than 0.3 μm.

A-2. Method for Manufacturing Semiconductor Device

Figure 2:
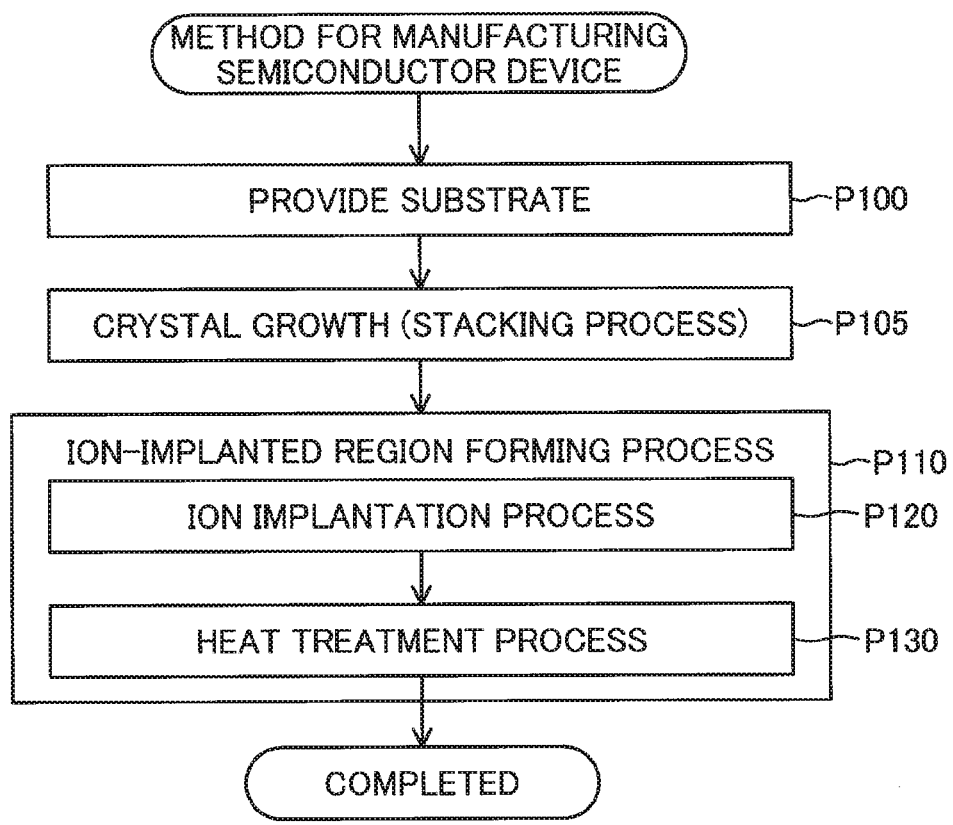
FIG. 2 is a process chart of a method for manufacturing the semiconductor device according to the first embodiment.

FIG. 2 is a process chart of a method for manufacturing the semiconductor device 100 according to the first embodiment. First, the manufacturer provides the substrate 110 (process P100). In this embodiment, the substrate 110 is mainly made of gallium nitride (GaN).

Next, the manufacturer performs crystal growth (process P105). Specifically, the manufacturer performs the following two processes: (i) a process that stacks the n-type semiconductor layer 112 on the substrate 110; and (ii) a process that stacks the p-type semiconductor layer 114 on the n-type semiconductor layer 112. In this embodiment, as the technique of crystal growth, the manufacturer adopts metal organic chemical vapor deposition (MOCVD). Process P105 will be also referred to as a stacking process.

In this embodiment, the substrate 110 and the n-type semiconductor layer 112 are made of the n-type semiconductor containing silicon (Si) as a donor element. The p-type semiconductor layer 114 is a p-type semiconductor containing magnesium (Mg) as an acceptor element.

After the stacking process (process P105), the manufacturer forms the ion-implanted region 116 in the partial region of the p-type semiconductor layer 114 (process P110). Process P110 will be also referred to as an ion-implanted region forming process. The ion-implanted region forming process (process P110) includes an ion implantation process (process P120) and a heat treatment process (process P130). In process P120, the p-type impurity is ion-implanted into the p-type semiconductor layer 114. In process P130, heat treatment is performed to activate the p-type impurity thus ion-implanted. Process P120 will be also referred to as p-type ion implantation process, and process P130 will be also referred to as a heat treatment process.

The manufacturer ion-implants the p-type impurity into the p-type semiconductor layer 114 (process P120). In this embodiment, the manufacturer uses magnesium (Mg) as the p-type impurity ion-implanted into the p-type semiconductor layer 114.

Specifically, the manufacturer first forms a film 210 on the p-type semiconductor layer 114. The film 210 is used to adjust a distribution of the impurity, which is implanted by ion implantation, in the depth direction of the p-type semiconductor layer 114. In other words, the film 210 is used to gather the element implanted in the p-type semiconductor layer 114, to the vicinity of the surface of the p-type semiconductor layer 114. The film 210 also serves to protect the surface of the p-type semiconductor layer 114 from being damaged by ion implantation. In this embodiment, preferably, the film 210 is made of such a material as not to become a donor when entering the p-type semiconductor layer 114. As the material of the film 210, for example, Group III nitride semiconductor such as aluminum nitride (AlN), aluminum gallium nitride (AlGaN), and boron nitride (BN) may be used. In this embodiment, the manufacturer adopts metal organic chemical vapor deposition (MOCVD) to form the film 210.

Next, the manufacturer forms a mask 220 on part of the film 210. The mask 220 is formed above a region of the p-type semiconductor layer 114 in which no ion implantation is performed. In this embodiment, the manufacturer uses a photoresist to form the mask 220. In this embodiment, the mask 220 has a film thickness of approximately 2 μm.

The manufacturer subsequently performs the ion implantation from the upper side of the p-type semiconductor layer 114. In this embodiment, the manufacturer performs ion implantation of magnesium (Mg) into the p-type semiconductor layer 114. The dose amount at the time of ion implantation is, preferably, equal to or larger than $2.0 \times 10^{14}$ cm$^{-2}$ and equal to or less than $3.0 \times 10^{15}$ cm$^{-2}$, more preferably, equal to or larger than $1.0 \times 10^{15}$ cm$^{-2}$ and equal to or less than $3.0 \times 10^{15}$ cm$^{-2}$. Preferably, the manufacturer adjusts the accelerating voltage at the time of ion implantation to make the thickness of the ion-implanted region larger than 0 and equal to or less than 0.4 μm. The number of times of ion implantation may be once or may be a plurality of times. In view of prevention of the channeling effect at the time of ion implantation, preferably, an ion implantation angle is equal to or larger than 5° and equal to or less than 15° relative to the Z-axis direction. In this embodiment, the ion implantation angle is 9°. Preferably, the temperature of the substrate 110 at the time of ion implantation is equal to or higher than 20° C. and equal to or lower than 800° C. In this embodiment, the temperature of the substrate 110 at the time of ion implantation is equal to or higher than 25° C.

Figure 3:
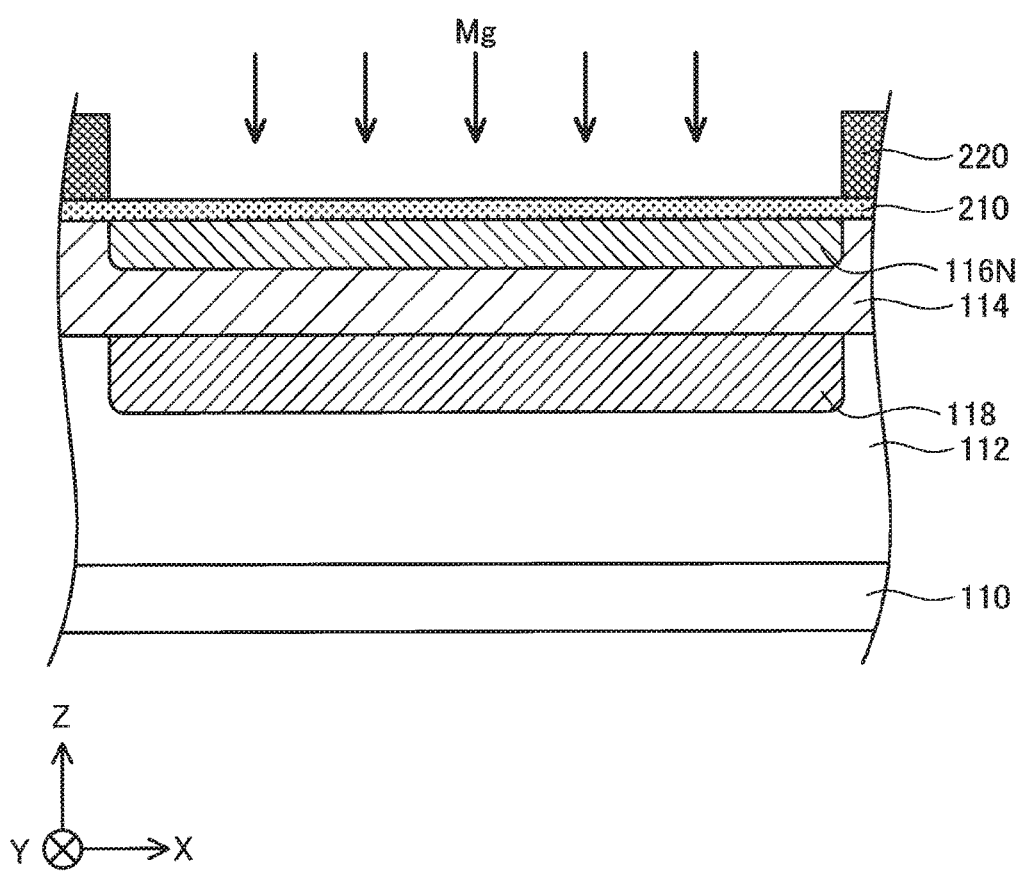
FIG. 3 is a sectional view of the semiconductor device, schematically illustrating a state of ion implantation in progress.

FIG. 3 is a sectional view of the semiconductor device, schematically illustrating a state of ion implantation in progress. As a result of the ion implantation, the element is implanted into a region of the p-type semiconductor layer 114 under the remaining part of the film 210 that is not covered with the mask 220. This region thus formed is an ion-implanted region 116N. The concentration of the p-type impurity in the ion-implanted region 116N is adjustable as desired by controlling the material and the film thickness of the film 210 and adjusting the accelerating voltage and the dose amount of ion implantation. It should be noted that the p-type impurity implanted into the ion-implanted region 116N is not activated to serve as an acceptor element. Consequently, the ion-implanted region 116N immediately after the ion implantation is a region of high resistance. Although the p-type impurity containing region 118 has not been formed yet in the ion implantation process, the p-type impurity containing region 118 is illustrated in FIG. 3 to describe a positional relationship between the ion-implanted region 116N and the p-type impurity containing region 118.

Next, the manufacturer removes the film 210 and the mask 220. In this embodiment, the manufacturer removes the film 210 and the mask 220 by wet etching. Thus, the ion implantation process (process P120 (see FIG. 2)) is completed.

After the ion implantation process (process P120), the manufacturer performs the heat treatment process (process P130) to activate the p-type impurity in the ion-implanted region 116N. In the heat treatment process (process P130), the manufacturer heats the ion-implanted region 116N to form the ion-implanted region 116 having p-type conductivity.

First, the manufacturer forms a cap film on the p-type semiconductor layer 114 and the ion-implanted region 116N. The cap film serves to protect the surface of the p-type semiconductor layer 114 and the surface of the ion-implanted region 116N from being damaged by heating. The cap film also serves to prevent gallium (Ga) and nitrogen (N) from escaping from the p-type semiconductor layer 114. As a material of the cap film, nitrides are preferable. Examples include, but are not limited to, silicon nitride (SiN$_x$), aluminum nitride (AlN), aluminum gallium nitride (AlGaN), gallium nitride (GaN), and boron nitride (BN). The cap film may be formed by sputtering and metal organic chemical vapor deposition (MOCVD). In this embodiment, the manufacturer forms the cap film of aluminum nitride (AlN) by metal organic chemical vapor deposition.

Next, the manufacturer heats the p-type semiconductor layer 114 and the ion-implanted region 116N. The heating temperature of the p-type semiconductor layer 114 and the ion-implanted region 116N is, preferably, equal to or higher than 900° C. and equal to or lower than 1400° C., more preferably, equal to or higher than 1000° C. and equal to or lower than 1200° C. The heating time is, preferably, equal to or longer than 10 seconds and equal to or shorter than 10 minutes, more preferably, equal to or longer than 10 seconds and equal to or shorter than 5 minutes. As an atmospheric gas at the time of the heat treatment, preferably, at least one of nitrogen (N), ammonia (NH$_3$), and argon (Ar) is used.

As a result of the heat treatment process, the ion-implanted region 116N becomes the ion-implanted region 116 having p-type conductivity. The p-type impurity containing region 118 is formed below the ion-implanted region 116 and in a region of the n-type semiconductor layer 112 on the +Z-axis direction side through the ion implantation process (process P120) and the heat treatment process (process P130). That is, the p-type impurity containing region 118 is formed in part of the n-type semiconductor layer 112. The p-type impurity containing region 118 is formed by diffusion of the p-type impurity of the p-type semiconductor layer 114 into the n-type semiconductor layer 112. In this embodiment, as viewed in the stacking direction (Z-axis direction), the p-type impurity containing region 118 is at a position overlapped with the ion-implanted region 116.

The concentration of the p-type impurity in the p-type impurity containing region 118 is adjustable by regulating the accelerating voltage and the dose amount at the time of ion implantation (process P120) and regulating the heating temperature and the heating time in the heat treatment (process P130). For example, the accelerating voltage or the dose amount is increased at the time of ion implantation (process P120) so as to increase the concentration of the p-type impurity diffused into the p-type impurity containing region 118.

After the heat treatment, the manufacturer removes the cap film from the upper side of the p-type semiconductor layer 114 and the ion-implanted region 116N (ion-implanted region 116). In this embodiment, the manufacturer removes the cap film by wet etching. Thus, the heat treatment process (process P130 (see FIG. 2)) is completed, and at the same time, the ion-implanted region forming process (process P110) is completed. The above-described series of processes makes the semiconductor device 100 complete.

A-3. Advantageous Effects

The method for manufacturing the semiconductor device 100 according to the first embodiment ensures that the p-type impurity containing region 118 is formed in the ion-implanted region forming process (process P110) without ion implantation of the p-type impurity into the n-type semiconductor layer 112.

The method for manufacturing the semiconductor device 100 according to the first embodiment, which does not include ion implantation of the p-type impurity into the n-type semiconductor layer 112, prevents irregularity in the crystal structure of the n-type semiconductor layer 112, which may be caused by the ion implantation of the p-type impurity.

In the semiconductor device 100 according to the first embodiment, the p-type impurity containing region 118 is in contact with the p-type semiconductor layer 114. Consequently, in the heat treatment process for activating magnesium (Mg), which is the p-type impurity in the p-type semiconductor layer 114, magnesium (Mg), which is the p-type impurity in the p-type impurity containing region 118, is also activated. That is, in this process, hydrogen in the p-type impurity containing region 118 is discharged outside through the p-type semiconductor layer 114. This ensures that the p-type impurity in the p-type semiconductor layer 114 and the p-type impurity containing region 118 is activated at once to facilitate manufacturing the semiconductor device 100 according to the first embodiment.

Now will be described results of an evaluation test to attest to the fact that the p-type impurity containing region 118 is formed in the n-type semiconductor layer 112 through the above-described ion-implanted region forming process (process P110).

A-4. Evaluation Test

The following samples were used in the evaluation test. The examiner provided sample 1 to sample 3. Specifically, in the same method as in the first embodiment, the examiner first provided the substrates 110 (process P105) and performed crystal growth (process P110). Then, the examiner provided the following three samples: (i) sample 1 with the heat treatment process (process P130) but without the ion implantation process (process P120); (ii) sample 2 with the ion implantation process (process P120) but without the heat treatment process (process P130); and (iii) sample 3 with the ion implantation process (process P120) and the subsequent heat treatment process (process P130). Simply put, sample 1 to sample 3 have the following relationship. It should be noted that the examiner set the dose amount in ion implantation at $2.6 \times 10^{15}$ cm$^{-3}$.

Figure 4:
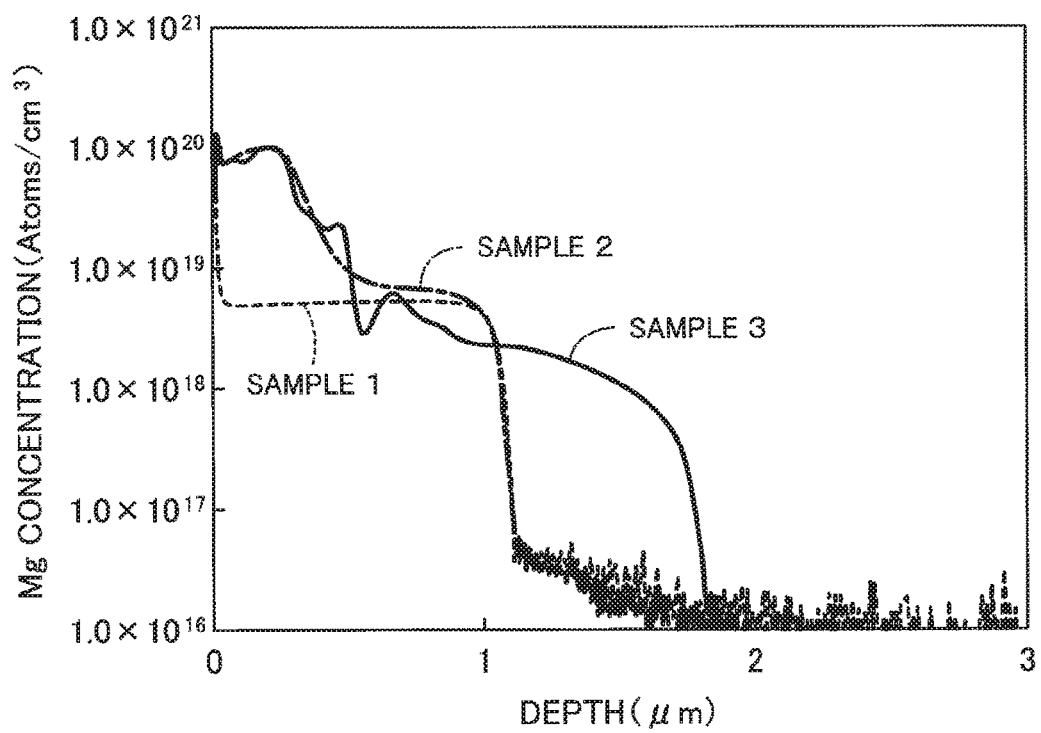
FIG. 4 is a graph showing results of an evaluation test.

Sample 1: without ion implantation, with heat treatment
Sample 2: with ion implantation, without heat treatment
Sample 3: with ion implantation, with heat treatment FIG. 4 is a graph showing the results of the evaluation test. FIG. 4 shows results of measurement by secondary ion mass spectrometry (SIMS) regarding impurity concentrations of magnesium (Mg) in the p-type semiconductor layer 114 and the n-type semiconductor layer 112 of each of the samples. In FIG. 4, the axis of abscissas represents depth (μm) of the p-type semiconductor layer 114 and the n-type semiconductor layer 112 in the −Z-axis direction whereas the axis of ordinates represents concentration (cm$^{-3}$) of magnesium (Mg). The depth 0 μm indicates the surface of the p-type semiconductor layer 114 (see FIG. 1) on the +Z-axis direction side.

The following is obviously understood from FIG. 4. In samples 1 to 3, an area where the depth is 0 μm to approximately 1 μm is an area where the magnesium concentration is approximately $1 \times 10^{12}$ cm$^{-3}$ or higher, and corresponds to the p-type semiconductor layer 114. An area where the depth is approximately 1.0 μm or larger corresponds to the n-type semiconductor layer 112.

Results of samples 2 and 3, which underwent the ion implantation process, reveal that an area where the depth is 0 μm to approximately 0.3 μm is an area where the magnesium concentration is approximately $1 \times 10^{20}$ cm$^{-3}$, and that this area is an area where magnesium was implanted by ion implantation.

In most of an area where the depth is approximately 0.3 μm to approximately 1.0 μm, sample 2, which underwent the ion implantation process, has a higher magnesium concentration than sample 1, which did not undergo the ion implantation process. This clearly indicates that magnesium (Mg), which was diffused into the p-type semiconductor layer 114 by ion implantation, reached the vicinity of the interface (depth: approximately 1.0 μm) between the p-type semiconductor layer 114 and the n-type semiconductor layer 112. It should be noted that in sample 2, which underwent the ion implantation process, the magnesium concentration in the vicinity of the interface (depth: approximately 1.0 μm) between the p-type semiconductor layer 114 and the n-type semiconductor layer 112 is approximately $6.0 \times 10^{18}$ cm$^{-3}$.

It can be considered that magnesium diffusion as deep as the vicinity of the interface (depth: approximately 1.0 μm) between the p-type semiconductor layer 114 and the n-type semiconductor layer 112 is caused by high kinetic energy of ion-implanted magnesium (Mg). This diffusion may unfortunately induce damages such as degradation of crystallinity and point defects in the p-type semiconductor layer 114. In sample 2, however, this diffusion stops at the interface (depth: approximately 1.0 μm) between the p-type semiconductor layer 114 and the n-type semiconductor layer 112, and the diffusion is not observed in the n-type semiconductor layer 112. In view of this, it can be considered that the n-type semiconductor layer 112 is free from damages that may be caused by high kinetic energy of ion-implanted magnesium (Mg).

Regarding samples 2 and 3, which underwent the ion implantation process, sample 2, which did not undergo the heat treatment process, is compared with sample 3, which underwent the heat treatment process. The comparison reveals that sample 3 had magnesium (Mg) diffused into the n-type semiconductor layer 112. Specifically, in sample 3, an area where the depth is approximately 1.0 μm to approximately 1.8 μm corresponds to the p-type impurity containing region 118. In FIG. 4, the p-type impurity containing region 118 has a magnesium concentration of $1.0 \times 10^{17}$ cm$^{-3}$ or higher.

In sample 1, which did not undergo the ion implantation process, a portion where the depth is approximately 1.0 μm or larger has a drastically lower magnesium concentration than a portion where the depth is 0 µm to approximately 1.0 µm. That is, when only the heat treatment process was performed, diffusion of magnesium of the p-type semiconductor layer 114 into the n-type semiconductor layer 112 was not observed.

Sample 1, which did not undergo the ion implantation process, is compared with sample 3, which underwent the ion implantation process. The comparison reveals that in an area where the depth is 0 µm to approximately 1.0 µm, sample 3 had some portions of a lower magnesium concentration than sample 1. Specifically, in an area where the depth is approximately 0.3 µm to approximately 1.0 µm, sample 3 had portions where the magnesium concentration is below approximately $4.0 \times 10^{18}$ cm$^{-3}$ and is as low as approximately $2.0 \times 10^{18}$ cm$^{-3}$. This clearly indicates that magnesium (Mg) diffused by the heat treatment included not only ion-implanted magnesium (Mg) but also magnesium (Mg) that had existed in the p-type semiconductor layer 114. This also indicates that an area of the p-type semiconductor layer 114 under the ion-implanted region 116 has a lower average concentration of the p-type impurity than an area of the p-type semiconductor layer 114 that is not under the ion-implanted region 116. It is obviously understood from the result of sample 1, which did not undergo the ion implantation process but underwent only the heat treatment, that even if only the heat treatment process is performed, magnesium (Mg) is not diffused from the p-type semiconductor layer 114 into the n-type semiconductor layer 112.

Here, regarding samples 2 and 3, amounts of magnesium at a depth of 0 µm to 2.0 µm were calculated. The value of sample 2 was equal to the value of sample 3. This indicates that magnesium (Mg) of the p-type impurity containing region 118 in sample 3 was diffused from the p-type semiconductor layer 114.

As has been described so far, it is obviously understood from the results of the evaluation test that ion implantation alone does not cause the p-type impurity to be diffused into the n-type semiconductor layer 112, but that the subsequent heat treatment serves to form the p-type impurity containing region 118. That is, it is obviously understood that after the n-type semiconductor layer 112 and the p-type semiconductor layer 114 undergo the above-described ion-implanted region forming process (process P110), the p-type impurity containing region 118 in the n-type semiconductor layer 112 is formed.

B. Second Embodiment

Figure 5:
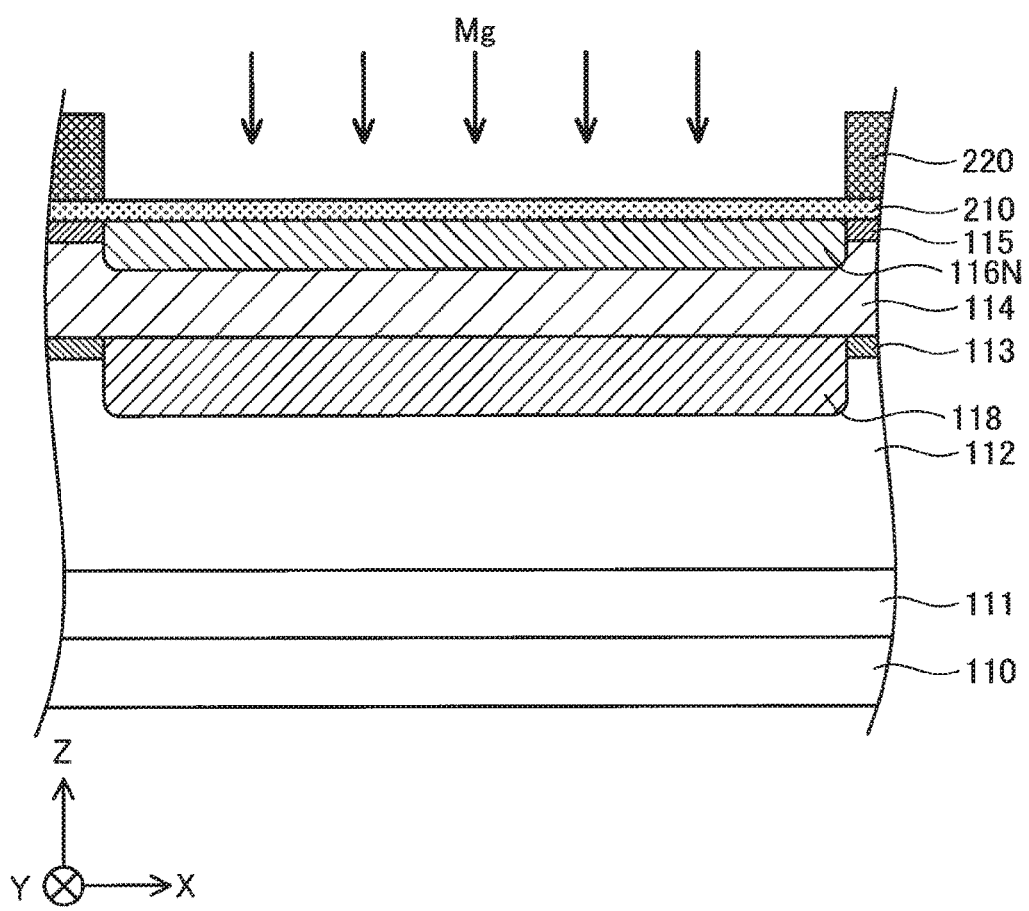
FIG. 5 is a sectional view of a semiconductor device according to a second embodiment, schematically illustrating a state of ion implantation in progress.

FIG. 5 is a sectional view of a semiconductor device according to a second embodiment, schematically illustrating a state of ion implantation in progress. The semiconductor device according to the second embodiment differs from the semiconductor device 100 according to the first embodiment by further including the following three elements: (i) an n-type semiconductor layer 111 interposed between the substrate 110 and the n-type semiconductor layer 112 and having an n-type impurity concentration higher than the n-type semiconductor layer 112; (ii) an n-type semiconductor layer 113 disposed in the n-type semiconductor layer 112 in such a manner as to intersect the p-type impurity containing region 118 and having an n-type impurity concentration higher than the n-type semiconductor layer 112; and (iii) an n-type semiconductor layer 115 disposed on the p-type semiconductor layer 114 and having an n-type impurity concentration higher than the n-type semiconductor layer 112. Otherwise, the semiconductor device according to the second embodiment is similar to the semiconductor device 100 according to the first embodiment. It should be noted that although the n-type semiconductor layer 113 intersects the p-type impurity containing region 118 in FIG. 5, the n-type semiconductor layer 113 may be disposed below the p-type impurity containing region 118. It should be also noted that at least one of the n-type semiconductor layer 111, the n-type semiconductor layer 113, and the n-type semiconductor layer 115 may be omitted. Any of the n-type semiconductor layer 111, the n-type semiconductor layer 113, and the n-type semiconductor layer 115 has an impurity concentration of $1.0 \times 10^{17}$ cm$^{-3}$ or higher, and has a thickness of 0.1 µm to 1 µm. It should be noted that the n-type semiconductor layer 115 will be also referred to as second n-type semiconductor layer. In this embodiment, the n-type semiconductor layer 111 may be utilized as a contact layer for forming a drain electrode when electrode formation on the substrate 110 involves difficulty. The n-type semiconductor layer 115 may be utilized as a contact layer for forming a source electrode. The n-type semiconductor layer 113 prevents inner potential from the p-type impurity containing region 118 from depleting the n-type semiconductor layer 112 and hindering electron transfer.

A method for manufacturing the semiconductor device according to the second embodiment also ensures that the p-type impurity containing region 118 is formed in the ion-implanted region forming process (process P110) without ion implantation of the p-type impurity into the n-type semiconductor layer 112.

C. Third Embodiment

Figure 6:
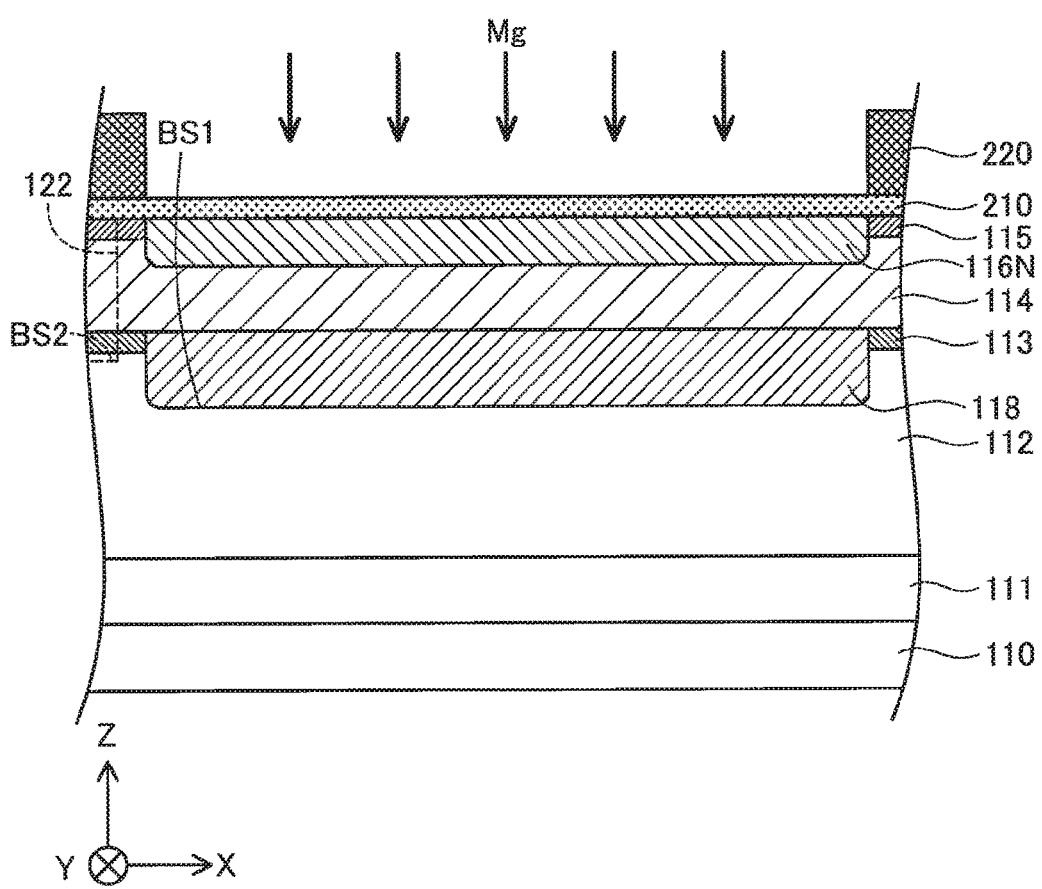
FIG. 6 is a sectional view of a semiconductor device according to a third embodiment, schematically illustrating a state of ion implantation in progress.

FIG. 6 is a sectional view of a semiconductor device according to a third embodiment, schematically illustrating a state of ion implantation in progress. The semiconductor device according to the third embodiment, which is similar to the semiconductor device according to the second embodiment, differs from the semiconductor device 100 according to the first embodiment by further including the following four elements: (i) the n-type semiconductor layer 111 interposed between the substrate 110 and the n-type semiconductor layer 112 and having an n-type impurity concentration higher than the n-type semiconductor layer 112; (ii) the n-type semiconductor layer 113 disposed in the n-type semiconductor layer 112 in such a manner as to intersect the p-type impurity containing region 118 and having an n-type impurity concentration higher than the n-type semiconductor layer 112; (iii) the n-type semiconductor layer 115 disposed on the p-type semiconductor layer 114 and having an n-type impurity concentration higher than the n-type semiconductor layer 112; and (iv) a trench structure. The semiconductor device according to the third embodiment is similar to the semiconductor device 100 according to the first embodiment. It should be noted that such a trench structure may be used as a trench gate structure in which a trench is formed in a semiconductor layer, with at least part of a gate electrode being embedded in the trench. The semiconductor device according to the third embodiment is a vertical trench MISFET (metal-insulator-semiconductor field-effect transistor).

In FIG. 6, an area 122 is where the trench 122 is formed in a process that follows ion implantation. That is, a manufacturing method according to the third embodiment further includes a trench forming process that forms the trench 122 that is recessed to pass through the p-type semiconductor layer 114 and reach the n-type semiconductor layer 112. In the third embodiment, the n-type semiconductor layer 115 is disposed on the p-type semiconductor layer 114, and the trench 122 is extended through the n-type semiconductor layer 115 as well. In the third embodiment, the trench forming process is performed after the ion implantation process. The ion implantation process, however, may be performed after the trench forming process.

In the stacking direction (Z-axis direction) of the n-type semiconductor layer 112 and the p-type semiconductor layer 114, a bottom face BS1 of the p-type impurity containing region 118 is located to be flush with a bottom face BS2 of the trench 122 or below (on the −Z-axis direction side of) the bottom face BS2 of the trench 122. In the third embodiment, in the stacking direction (Z-axis direction) of the n-type semiconductor layer 112 and the p-type semiconductor layer 114, the bottom face BS1 of the p-type impurity containing region 118 is located below (on the −Z-axis direction side of) the bottom face BS2 of the trench 122. With this arrangement, the semiconductor device according to the third embodiment ensures that potential crowding is more effectively suppressed in the vicinity of the outer periphery of the bottom face BS2 of the trench 122. Here, "bottom face" refers to the furthest surface of a region or layer concerned in the −Z-axis direction. In this embodiment, the trench 122 is not overlapped with the p-type impurity containing region 118. That is, ion implantation is not performed with respect to the area where the trench 122 is formed. This prevents the trench 122 from being damaged by ion implantation so as to obtain more reliable electrical properties.

The semiconductor device according to the third embodiment is a vertical trench MISFET (metal-insulator-semiconductor field-effect transistor). Consequently, a method for manufacturing the semiconductor device according to the third embodiment further includes the following four processes: a process that forms an insulation film inside of the trench 122; a process that forms a source electrode (also referred to as first electrode) and a body electrode, which are in contact with the n-type semiconductor layer 115; a process that forms a drain electrode (also referred to as second electrode) in contact with the n-type semiconductor, which is the substrate 110; and a process that forms a gate electrode (also referred to as control electrode) on the insulation film. The gate electrode serves to control a flow of electric current between the first electrode and the second electrode. It should be noted that when the substrate 110 is an insulator, the drain electrode is arranged to be in contact not with the substrate 110 but with the n-type semiconductor layer 111.

D. Fourth Embodiment

Figure 7:
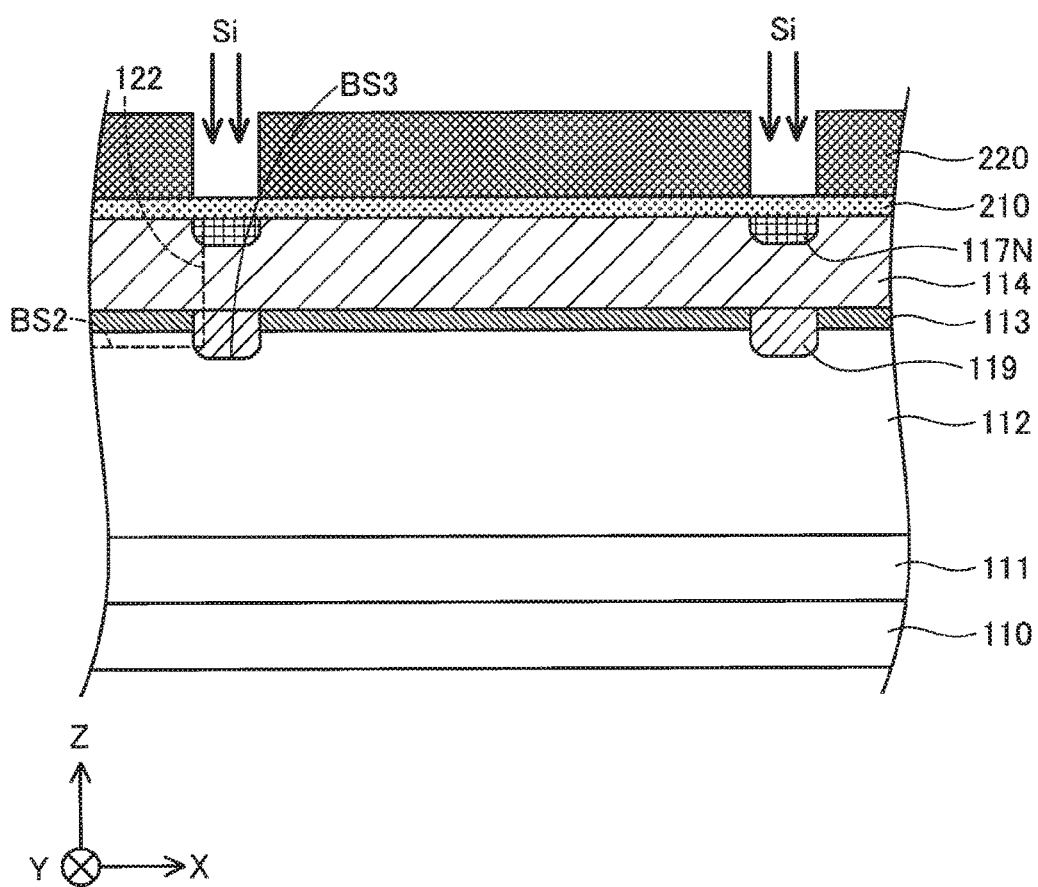
FIG. 7 is a sectional view of a semiconductor device according to a fourth embodiment, schematically illustrating a state of ion implantation in progress.
Figure 8:
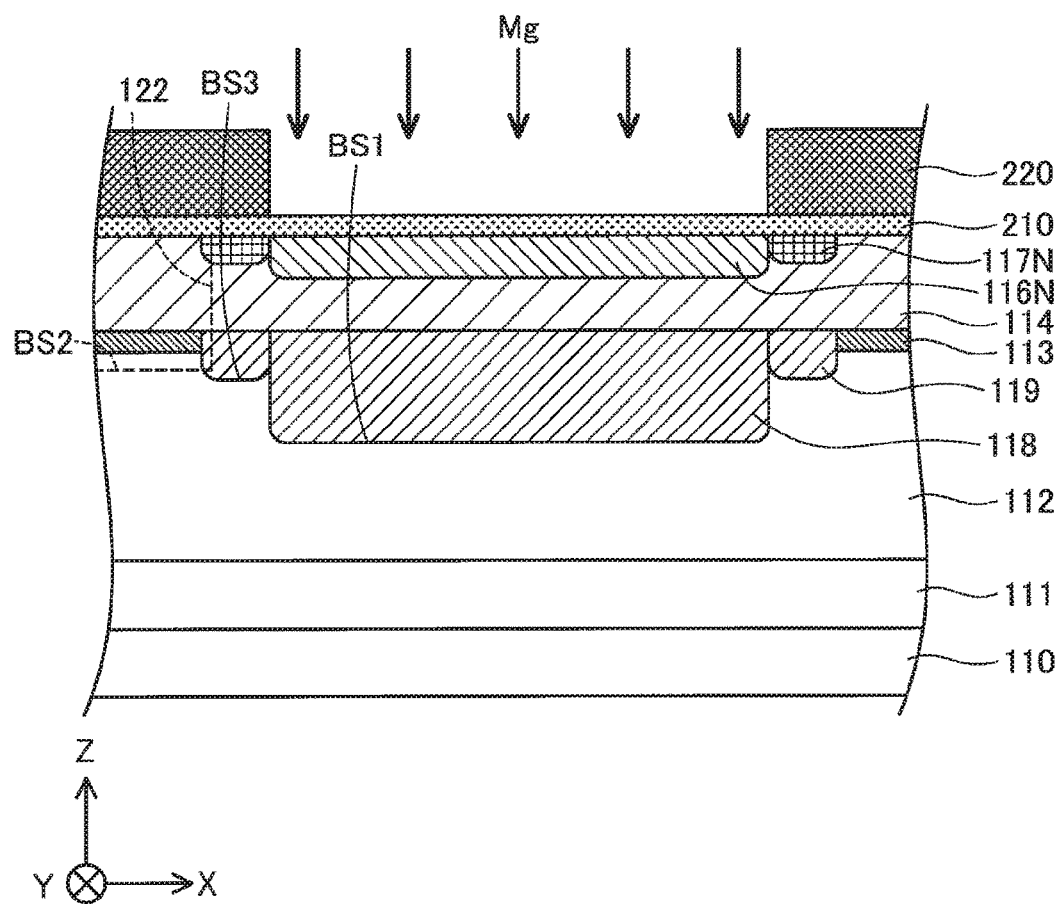
FIG. 8 is a sectional view of the semiconductor device according to the fourth embodiment, schematically illustrating a state of ion implantation in progress.

FIGS. 7 and 8 are sectional views of a semiconductor device according to a fourth embodiment, each schematically illustrating a state of ion implantation in progress. FIG. 7 illustrates in cross section a state of first ion implantation in progress. FIG. 8 illustrates in cross section a state of second ion implantation in progress.

The semiconductor device according to the fourth embodiment differs from the semiconductor device 100 according to the first embodiment except for further including the following four elements: (i) the n-type semiconductor layer 111 interposed between the substrate 110 and the n-type semiconductor layer 112; (ii) the n-type semiconductor layer 113 interposed between the n-type semiconductor layer 112 and the p-type semiconductor layer 114; (iii) p-type impurity containing regions 119; and (iv) ion-implanted regions 117N. Otherwise, the semiconductor device according to the fourth embodiment is similar to the semiconductor device 100 according to the first embodiment.

In the fourth embodiment, as illustrated in FIG. 7, as a first ion-implanted region forming process, an n-type ion implantation process is performed for ion implantation into the p-type semiconductor layer 114 using silicon (Si), which is an n-type impurity. As a result of the n-type ion implantation process, the ion-implanted regions 117N are formed on the surface of the p-type semiconductor layer 114. The subsequent heat treatment process serves to form the p-type impurity containing regions 119. It should be noted that the subsequent heat treatment process causes the ion-implanted regions 117N to be n-type semiconductor regions.

The first ion-implanted region forming process is followed by a second ion-implanted region forming process. As this process, as illustrated in FIG. 8, a p-type ion implantation process is performed for ion implantation into the p-type semiconductor layer 114 using magnesium (Mg), which is a p-type impurity. As a result of the p-type ion implantation process, the ion-implanted region 116N is formed. The subsequent heat treatment serves to form the p-type impurity containing region 118. The p-type impurity containing region 118 will be also referred to as first p-type impurity containing region 118. The p-type impurity containing regions 119 will be also referred to as second p-type impurity containing regions 119.

In FIGS. 7 and 8, the area 122 is where the trench 122 is formed in the trench forming process that follows the ion implantation process. As illustrated in FIG. 8, in the stacking direction (Z-axis direction) of the n-type semiconductor layer 112 and the p-type semiconductor layer 114, the bottom face BS1 of the p-type impurity containing region 118 and bottom faces BS3 of the p-type impurity containing regions 119 are located to be flush with the bottom face BS2 of the trench 122 or below (on the −Z-axis direction side of) the bottom face BS2 of the trench 122. In the fourth embodiment, in the stacking direction (Z-axis direction) of the n-type semiconductor layer 112 and the p-type semiconductor layer 114, both of the bottom face BS1 of the p-type impurity containing region 118 and the bottom faces BS3 of the p-type impurity containing regions 119 are located below (on the −Z-axis direction side of) the bottom face BS2 of the trench 122. Consequently, the semiconductor device according to the fourth embodiment ensures that potential crowding is more effectively suppressed in the vicinity of the outer periphery of the bottom face BS2 of the trench 122. Moreover, in the stacking direction (Z-axis direction) of the n-type semiconductor layer 112 and the p-type semiconductor layer 114, the bottom face BS1 of the p-type impurity containing region 118 is located below the bottom faces BS3 of the p-type impurity containing regions 119, and the bottom faces BS3 of the p-type impurity containing regions 119 are located below (on the −Z-axis direction side of) the bottom face BS2 of the trench 122. This reduces potential crowding from the p-type impurity containing region 118.

In the trench forming process, the trench 122 is formed at a position overlapped with at least part of the p-type impurity containing region 119 in such a manner that at least part of the bottom face BS2 of the trench is formed by the p-type impurity containing region 119. In the fourth embodiment, in the trench forming process, the trench 122 is formed at a position overlapped with part of the p-type impurity containing region 119 in such a manner that part of the bottom face BS2 of the trench is formed by the p-type impurity containing region 119. Consequently, the semiconductor device according to the fourth embodiment ensures that potential crowding is more effectively suppressed in the vicinity of the outer periphery of the bottom face BS2 of the trench 122.

E. Fifth Embodiment

Figure 9:
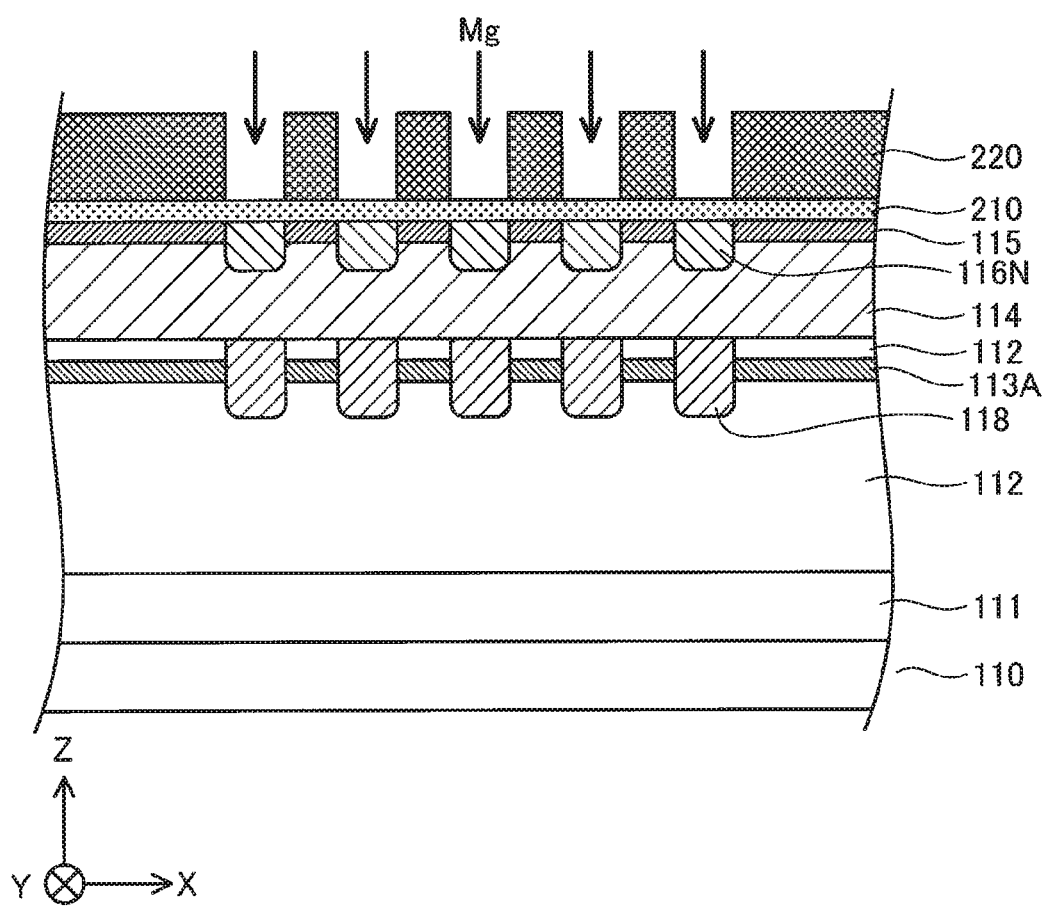
FIG. 9 is a sectional view of a semiconductor device according to a fifth embodiment, schematically illustrating a state of ion implantation in progress.

FIG. 9 is a sectional view of a semiconductor device according to a fifth embodiment, schematically illustrating a state of ion implantation in progress. In the fifth embodiment, the p-type impurity containing regions 118 are disposed in the terminal portion. In the fifth embodiment, the p-type impurity containing regions 118 have such a multiple-loop arrangement as to surround an active region where a transistor or a diode is formed. In the fifth embodiment, the p-type impurity containing regions 118 have a five-loop arrangement. It should be noted that in place of the five-loop arrangement, a four or less-loop arrangement or a six or more-loop arrangement may be used. The p-type impurity containing regions 118 may not necessarily have the loop arrangement but may have discontinuous portions. In such a multiple arrangement, the number, widths, and intervals of the p-type impurity containing regions 118 may be changed to ensure formation of the terminal portion in accordance with desired properties.

Figure 10:
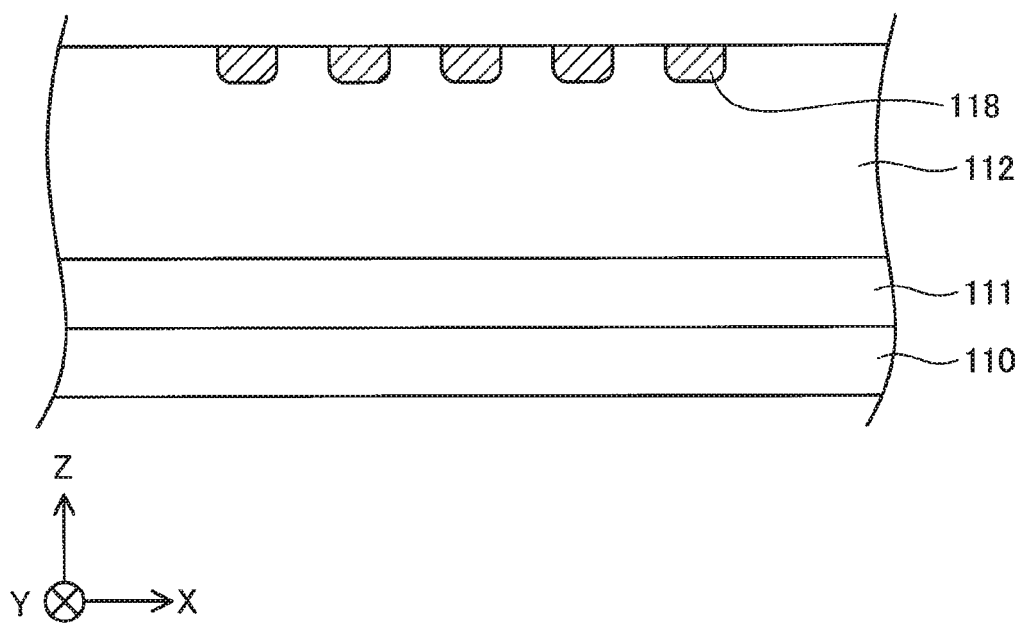
FIG. 10 is a schematic diagram illustrating a state of the semiconductor device according to the fifth embodiment from which layers such as a gallium nitride layer are removed.

FIG. 10 is a schematic diagram illustrating a state of the semiconductor device according to the fifth embodiment from which the n-type semiconductor layer 113 and its upper layers are removed by, for example, dry etching. Such a state may be adopted as a possible embodiment.

F. Other Embodiments

The present disclosure is not limited to the embodiments and examples described above but may be implemented by a diversity of other configurations without departing from the scope of the present disclosure. For example, the technical features of the embodiments corresponding to the technical features of the aspects described in SUMMARY may be replaced or combined appropriately so as to solve some or all of the circumstances described above or to achieve some or all of the advantageous effects described above. The technical features may be omitted appropriately unless the technical feature concerned is described as essential herein.

In the first embodiment, no other layers are interposed between the substrate 110 and the n-type semiconductor layer 112. Other layers, however, may be interposed between these two layers. As other layers, the following three examples may be used: (i) the n-type semiconductor layer 111 (having an n-type impurity concentration of $5.0 \times 10^{18}$ cm$^{-3}$ and a thickness of 0.5 µm to 1 µm) having an n-type impurity concentration higher than the n-type semiconductor layer 112; (ii) a layer to reduce lattice mismatching, which layer includes an aluminum nitride (AlN) layer and a gallium nitride (GaN) layer in sequence from contact with the substrate 110; and (iii) a low-temperature sedimentary buffer layer. When the n-type semiconductor layer 111, which has an n-type impurity concentration higher than the n-type semiconductor layer 112, is interposed between the substrate 110 and the n-type semiconductor layer 112, and when the substrate 110 is an insulator, the n-type semiconductor layer 111, which has an n-type impurity concentration higher than the n-type semiconductor layer 112, serves as a drain contact layer, and a drain electrode is formed to be in contact with the drain contact layer.

In the first embodiment, no other layers are interposed between the n-type semiconductor layer 112 and the p-type semiconductor layer 114. Other layers, however, may be interposed between these two layers. As other layers, for example, the n-type semiconductor layer 113 (having an n-type impurity concentration of $5.0 \times 10^{17}$ cm$^{-3}$ or less and a thickness of 1 µm or less) having an n-type impurity concentration higher than the n-type semiconductor layer 112 may be used. The n-type semiconductor layer 113 prevents inner potential from the p-type impurity containing region 118 from depleting the n-type semiconductor layer 112 and hindering electron transfer.

In the first embodiment, no semiconductor layer is disposed on the p-type semiconductor layer 114. Other layers, however, may be disposed on the p-type semiconductor layer 114. As other layers, for example, the n-type semiconductor layer 115 (having an n-type impurity concentration of $5.0 \times 10^{18}$ cm$^{-3}$ and a thickness of 0.5 µm or less) having a high n-type impurity concentration may be used. This layer serves as a source contact layer.

In the third to fifth embodiments, as the semiconductor devices to which the present disclosure is applied, the vertical trench MISFETs are described. For example, the vertical trench MISFET in the third embodiment has a configuration described below.

Figure 11:
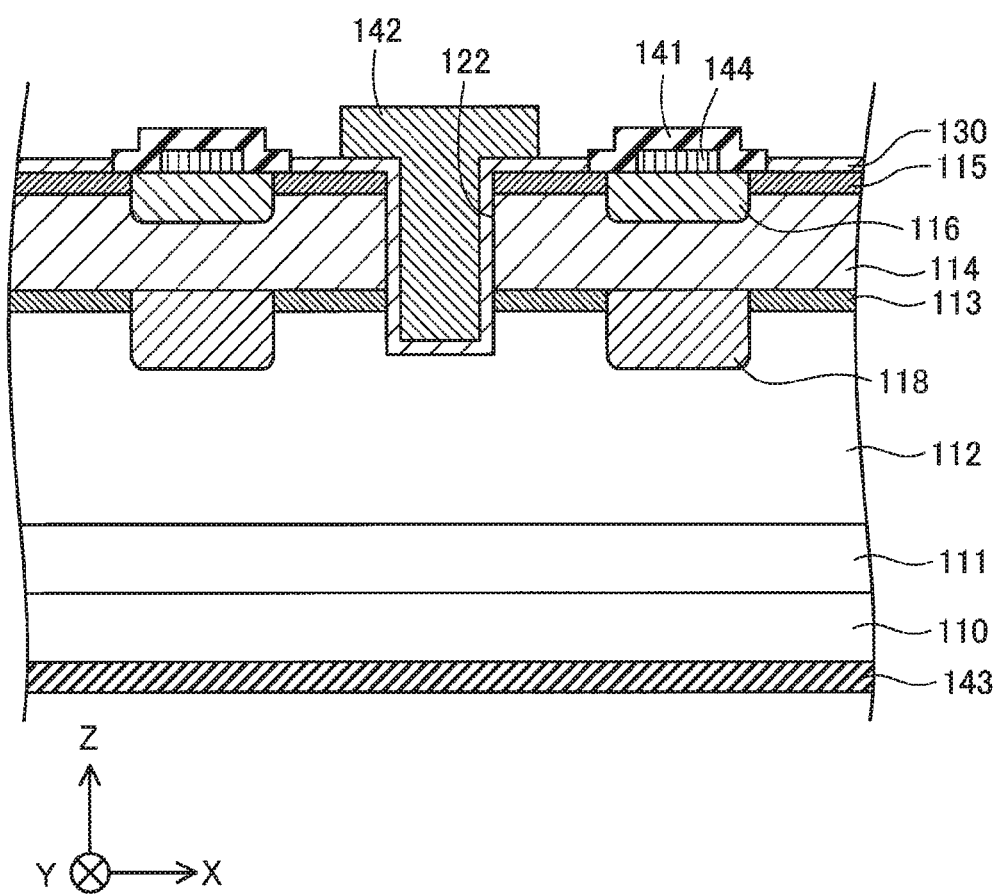
FIG. 11 is a schematic diagram illustrating a vertical trench MISFET according to the third embodiment.

FIG. 11 is a schematic diagram illustrating the vertical trench MISFET in the third embodiment. The vertical trench MISFET in the third embodiment includes the insulation film 130, source electrodes 141, a gate electrode 142, a drain electrode 143, and body electrodes 144. The semiconductor device to which the present disclosure is applied, however, is not limited to this configuration but may be a semiconductor device having a trench gate structure of, for example, an insulated gate bipolar transistor (IGBT), and using the principle of forming an inverted layer by a control electrode so as to control electric current.

In the above-described embodiments, silicon (Si) is employed as the n-type impurity. The present disclosure, however, is not limited to this. As the n-type impurity, for example, oxygen (O) or germanium (Ge) may be employed.

What is claimed is:

1. A method for manufacturing a semiconductor device, the method comprising:
   a stacking process that stacks a p-type semiconductor layer of Group III nitride containing a p-type impurity on a first n-type semiconductor layer of Group III nitride containing an n-type impurity;
   a p-type ion implantation process that ion-implants the p-type impurity into the p-type semiconductor layer; and
   a heat treatment process that performs heat treatment to activate the ion-implanted p-type impurity,
   wherein the p-type ion implantation process and the heat treatment process are performed such that the p-type impurity of the p-type semiconductor layer is diffused into the n-type semiconductor layer to form a first p-type impurity containing region in at least part of the first n-type semiconductor layer and below a region of the p-type semiconductor layer into which the ion implantation has been performed.

2. The method for manufacturing the semiconductor device in accordance with claim 1, further comprising:
   an n-type ion implantation process that ion-implants the n-type impurity into the p-type semiconductor layer after the stacking process and before the heat treatment process,
   wherein the n-type ion implantation process and the heat treatment process are performed such that an n-type semiconductor region is formed on a surface of the p-type semiconductor layer, and the p-type impurity of the p-type semiconductor layer is diffused into the first n-type semiconductor layer to form a second p-type impurity containing region in at least part of the first n-type semiconductor layer and below the n-type semiconductor region.

3. The method for manufacturing the semiconductor device in accordance with claim 2, further comprising:

a trench forming process that forms a trench that is recessed to pass through the n-type semiconductor region and the p-type semiconductor layer and reach the first n-type semiconductor layer, wherein in a stacking direction of the first n-type semiconductor layer and the p-type semiconductor layer, a bottom face of the second p-type impurity containing region is located to be flush with a bottom face of the trench or below the bottom face of the trench.

4. The method for manufacturing the semiconductor device in accordance with claim 3, wherein the trench forming process is performed after the n-type ion implantation process, and wherein in the trench forming process, the trench is formed at a position overlapped with at least part of the second p-type impurity containing region in such a manner that at least part of the bottom face of the trench is formed by the second p-type impurity containing region.

5. The method for manufacturing the semiconductor device in accordance with claim 3, further comprising:

a process that forms an insulation film inside of the trench;

a process that forms a first electrode in contact with the n-type semiconductor region;

a process that forms a second electrode in contact with the first n-type semiconductor layer; and a process that forms a control electrode on the insulation film, the control electrode being configured to control a flow of electric current between the first electrode and the second electrode.

6. A method for manufacturing a semiconductor device, the method comprising:

a stacking process that stacks a p-type semiconductor layer of Group III nitride containing a p-type impurity on a first n-type semiconductor layer of Group III nitride containing an n-type impurity, and stacks a second n-type semiconductor layer of Group III nitride containing the n-type impurity on the p-type semiconductor layer;

a p-type ion implantation process that ion-implants the p-type impurity into the second n-type semiconductor layer; and a heat treatment process that performs heat treatment to activate the ion-implanted p-type impurity, wherein the p-type ion implantation process and the heat treatment process are performed such that the p-type impurity of the p-type semiconductor layer is diffused into the first n-type semiconductor layer to form a p-type impurity containing region in at least part of the first n-type semiconductor layer and below a region of the second n-type semiconductor layer into which the ion implantation has been performed.

7. The method for manufacturing the semiconductor device in accordance with claim 6, further comprising:

a trench forming process that forms a trench that is recessed to pass through the second n-type semiconductor layer and the p-type semiconductor layer and reach the first n-type semiconductor layer, wherein in a stacking direction of the first n-type semiconductor layer and the p-type semiconductor layer, a bottom face of the p-type impurity containing region is located to be flush with a bottom face of the trench or below the bottom face of the trench.

8. The method for manufacturing the semiconductor device in accordance with claim 7, further comprising:

a process that forms an insulation film inside of the trench;

a process that forms a first electrode in contact with the second n-type semiconductor layer;

a process that forms a second electrode in contact with the first n-type semiconductor layer; and a process that forms a control electrode on the insulation film, the control electrode being configured to control a flow of electric current between the first electrode and the second electrode.

* * * * *